United States Patent
Filtvedt et al.

(10) Patent No.: US 9,793,116 B2
(45) Date of Patent: Oct. 17, 2017

(54) REACTOR AND METHOD FOR PRODUCTION OF SILICON BY CHEMICAL VAPOR DEPOSITION

(71) Applicant: Dynatec Engineering AS, Askim (NO)

(72) Inventors: Werner O. Filtvedt, Tomter (NO); Josef Filtvedt, Tomter (NO)

(73) Assignee: Dynatec Engineering AS, Askim (NO)

( * ) Notice: Subject to any disclaimer, the term of this patent is extended or adjusted under 35 U.S.C. 154(b) by 0 days.

(21) Appl. No.: 14/346,944

(22) PCT Filed: Sep. 25, 2012

(86) PCT No.: PCT/NO2012/050184
§ 371 (c)(1),
(2) Date: Mar. 24, 2014

(87) PCT Pub. No.: WO2013/048258
PCT Pub. Date: Apr. 4, 2013

(65) Prior Publication Data
US 2014/0242783 A1 Aug. 28, 2014

(30) Foreign Application Priority Data
Sep. 26, 2011 (NO) .................................. 20111304

(51) Int. Cl.
*H01L 21/02* (2006.01)
*C01B 33/027* (2006.01)

(52) U.S. Cl.
CPC ........ *H01L 21/0262* (2013.01); *C01B 33/027* (2013.01); *H01L 21/02532* (2013.01)

(58) Field of Classification Search
CPC ............ H01L 21/0254; H01L 21/0262; H01L 21/67115
USPC .................................. 438/478; 257/E21.108
See application file for complete search history.

(56) References Cited

U.S. PATENT DOCUMENTS

| 3,865,647 | A | | 2/1975 | Reuschel |
| 3,979,490 | A | * | 9/1976 | Dietze .................... C23C 16/01 264/81 |
| 4,343,772 | A | | 8/1982 | Frosch et al. |

(Continued)

FOREIGN PATENT DOCUMENTS

| JP | 1986-236608 | 10/1986 |
| JP | 1986-180168 | 11/1986 |

(Continued)

OTHER PUBLICATIONS

Flister, Synnove, "International Search Report," prepared for PCT/NO2012/050184, as completed Dec. 20, 2012, 4 pages.

*Primary Examiner* — Edward Chin
(74) *Attorney, Agent, or Firm* — Winstead PC

(57) ABSTRACT

The invention provides a reactor for the manufacture of silicon by chemical vapor deposition (CVD), the reactor comprises a reactor body that can rotate around an axis with the help of a rotation device operatively arranged to the reactor, at least one sidewall that surrounds the reactor body, at least one inlet for reaction gas, at least one outlet for residual gas and at least one heat appliance operatively arranged to the reactor. The reactor is characterized in that during operation for the manufacture of silicon by CVD, the reactor comprises a layer of particles on the inside of at least, one sidewall.

18 Claims, 2 Drawing Sheets

(56) References Cited

U.S. PATENT DOCUMENTS

Figure 1:
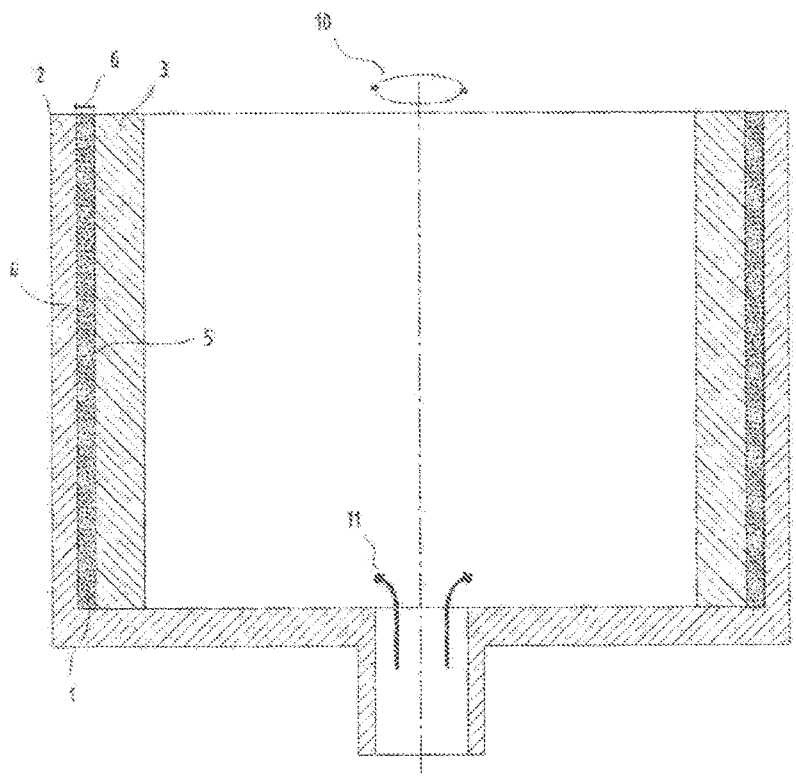

| | | | |
|---|---|---|---|
| 4,797,241 A * | 1/1989 | Peterson | B01J 3/062 |
| | | | 264/122 |
| 4,818,495 A * | 4/1989 | Iya | B01J 8/1836 |
| | | | 422/145 |
| 4,981,102 A * | 1/1991 | Gautreaux | C23C 16/45506 |
| | | | 118/725 |
| 5,254,172 A | 10/1993 | Otaki et al. | |
| 5,260,538 A * | 11/1993 | Clary | B01J 8/1836 |
| | | | 219/628 |
| 5,284,519 A | 2/1994 | Gadgil | |
| 5,810,934 A | 9/1998 | Lord et al. | |
| 7,449,065 B1 * | 11/2008 | Powell | C30B 11/14 |
| | | | 117/108 |
| 2004/0211496 A1* | 10/2004 | Khattak | C30B 11/002 |
| | | | 148/538 |
| 2007/0154382 A1 | 7/2007 | Edwin et al. | |
| 2008/0213156 A1* | 9/2008 | Muller | C01B 33/027 |
| | | | 423/349 |
| 2009/0238971 A1 | 9/2009 | Higashi et al. | |
| 2012/0251427 A1 | 10/2012 | Filtvedt et al. | |
| 2013/0052804 A1* | 2/2013 | Song | C23C 16/45565 |
| | | | 438/478 |

FOREIGN PATENT DOCUMENTS

| | | |
|---|---|---|
| JP | 1993-139891 | 6/1993 |
| JP | 1997-199435 | 7/1997 |
| JP | 2004018369 A | 1/2004 |
| JP | 2008509071 A | 3/2008 |
| NO | 20092111 A | 11/2010 |
| NO | 20100210 A | 8/2011 |
| WO | WO-2005/016820 A1 | 2/2005 |
| WO | WO-2006018101 A1 | 2/2006 |
| WO | WO-2010060630 A2 | 6/2010 |
| WO | WO-2010136529 A1 | 12/2010 |
| WO | WO-2011044451 A2 | 4/2011 |
| WO | WO-2011065839 A1 | 6/2011 |

* cited by examiner

REACTOR AND METHOD FOR PRODUCTION OF SILICON BY CHEMICAL VAPOR DEPOSITION

FIELD OF THE INVENTION

The present invention relates to the manufacture of silicon for application in sun cells and electronics. In more detail, the invention relates to a reactor and a method for production of silicon, in particular the deposition surface of a rotating reactor for manufacture of silicon by chemical vapour deposition, CVD.

BACKGROUND OF THE INVENTION AND PRIOR ART

The development of new methods to use renewable, non-polluting energy sources is essential to meet future needs for energy. Energy from the sun is one of the energy sources which are of the greatest interest in this context.

Silicon is a critical raw material for both the electronics industry and the solar cell industry. Although there are alternative materials for specific applications, multi-crystalline and mono-crystalline silicon will be the material of choice for the foreseeable future. Improved availability and economics of production of multi-crystalline silicon will increase the growth possibilities for both these industries, in particular the application of solar cells for renewable energy.

Currently, to manufacture silicon of a satisfactory purity for use in solar cells or electronics, chemical vapour deposition methods (CVD—Chemical Vapour Deposition) are primarily used. Different embodiments of the Siemens process are the most used forms of CVD for the manufacture of polycrystalline silicon. In this method, silicon containing gases, such as silane or trichlorosilane, and other gases such as hydrogen and argon, are fed into a cooled container and silicon is deposited on one or more resistance-heated rods. The process is very energy and labour demanding. A more detailed description of the most used process can be found in the U.S. Pat. No. 3,979,490.

Another CVD method uses a fluidized bed, whereby silicon seed particles are fluidised and held in an upward flowing gas stream, with the gas stream comprising silicon-containing gas from which silicon can be deposited onto the seed particles. A full description of CVD methods with a fluidised bed and associated equipment and operating parameters for the manufacture of silicon, including gas mixtures, temperatures for the deposition and related problems and limitations can be found in the U.S. Pat. No. 4,818,495 and U.S. Pat. No. 5,810,934, and reference is given to these publications for more information.

A rotating CVD reactor has been developed and a patent has been applied for by Dynatec Engineering with the patent applications NO 2009 2111 and NO 2010 0210. A reactor for the manufacture of silicon by chemical vapour deposition is thus provided, with the reactor comprising a reactor body that forms a container, with at least one inlet for a silicon-containing gas, at least one outlet and at least one heat appliance as a part of, or operatively arranged to, the reactor. In one main embodiment the reactor is characterised in that it rotates so that the reaction gas is subjected to centripetal acceleration. In the following, such a reactor is designated as a Dynatec reactor.

The principle for a Dynatec reactor is that a silicon-containing gas, preferably silane, is fed into a rotating, heated container. The difference in density between the reaction gas and the residual gas makes it possible to separate the gases with the help of the centripetal acceleration. The heavy reaction gas is forced out from the centre of the container, whereupon it decomposes when it is heated up by the inner wall of the container, whereupon silicon is deposited. This gives a higher rate of deposition and a better utilisation of the reaction gas, at the same time as the need for selective cooling of surfaces where the decomposition shall not occur is minimised. Together, this reduces the energy consumption per kilo produced silicon. However, there is a need for further improvement of the Dynatec reactor to lower the cost per produced kg super-clean silicon further and the aim of the present invention is to provide a such improvement.

SUMMARY OF THE INVENTION

The invention provides a reactor for the manufacture of silicon by chemical vapour deposition (CVD), the reactor comprises a reactor body that can be rotated around an axis with the help of a rotating appliance operatively arranged to the reactor, at least one sidewall that surrounds the reactor body, at least one inlet for reaction gas, at least one outlet for residual gas and at least one heat appliance operatively arranged to the reactor. The reactor is characterised in that it comprises a layer of particles on the inside of the, at least, one side wall during operation for the manufacture of silicon by CVD.

It is an advantage that the reactor rotates during operation and it is an advantage that the layer of particles comprises loose particles, at least nearest the reactor body. It is most preferred that the whole, or part of, the particle layer, in particular nearest the reactor body, comprises loose particles. Thereby, solid silicon is chemically vapour deposited on the layer of particles during operation, with the sidewall with the layer of particles being held at CVD conditions, and it is thereby easier to take out the solid silicon. Loose particles in the layer are held in place by the rotation of the reactor or more particularly, by the centripetal forces. A layer comprising loose particles against the reactor body and the deposited solid silicon ensures a simple removal of the produced silicon. The outer part, or the whole layer can comprise a layer of bound particles as long as the layer leads to a simpler removal of produced silicon than without the layer, in that the layer is weakly bound and breaks up easily, said layer is described as an easily broken up particle layer.

With the Dynatec reactor, if the reactor shall be re-used, it can be a challenge to remove the completed block of silicon from the reactor after so much silicon has been deposited inside the reactor that it is not appropriate to continue the process for the manufacture of silicon. The block of deposited silicon must then be removed before the process can be started up again. With the present invention the silicon will come off the inner wall of the reactor easily because the layer of particles functions as a ball-bearing layer or a gliding layer from where the block of silicon can be taken out more easily. Thereby, the advantage is that the production process can be operated much more continuously, which reduces the production costs.

The reactor can comprise a pipe section or be assembled by several sidewalls or sections, preferably so that the reactor can be opened easily or the block of silicon can be extruded out. The cross section of the reactor body orthogonally to the axis is preferably circular, but not necessarily, however it is preferably circular, with the layer of particles on the sidewall in an operation mode, with rotation and heating for the manufacture of silicon by CVD, to achieve the optimal operating conditions. In more detail particles are fed in or material is arranged in the reactor so that the centripetal acceleration arranges the particle layer so that a circular cross section is achieved. With the term layer of particles one means the material which is, or during the operating conditions becomes, particulate so that the produced block of silicon can be taken out of the reactor easily. The material can be fed in as a solid, a liquid or a semiliquid. Thereby, the term layer of particles also comprises deposits or material which during heating and rotation of the reactor intentionally break up to particulate material, shell fragments, fibres or other forms that give the intended gliding effect which makes taking out the produced blocks of silicon simpler.

The reactor does not necessarily have to have a top and a bottom, as one of or both the top and bottom can be external parts, for example, a rotation table and a top that can be folded in a rotation appliance and which rotates in the same direction. There is only, at least, one sidewall that surrounds the reactor body which is obligatory, top and bottom can therefore be external components, which represents a preferred embodiment of the reactor according to the invention.

The layer of particles preferably comprises material which contaminates the produced silicon to the smallest extent possible, it is preferred that the particles of silicon are of a metallurgical quality or purer, most preferred is silicon of the same purity as the silicon that is chemically vapour deposited. It is an advantage that the layer of particles comprises, at least over a part of the thickness, for example, over the thickness of at least three median particle diameters of, in the main, round particles, thereby to achieve a good ball-bearing functionality.

The reactor is preferably formed as a pipe section that can rotate about its own axis. Thereby, the reactor can have any orientation during operation, which can be very practical.

In a preferred embodiment the reactor is formed as a standing, conical pipe section that can rotate around its longitudinal axis, with a circular inner cross section and the largest diameter at the upper end. Thereby, the sidewall of the reactor has a taper that can be adapted so that the particle layer lies naturally correct onto the inner sidewall of the reactor. In more detail, the force of gravity is balanced on the particles against the vertical component in the counter force from the wall. For example, a typical reactor, with a 2-pole electro motor driven at 50 Hz with 3000 rotations per minute, rpm, will generate a centripetal acceleration of 1000 g on the particles, thus the centripetal acceleration is 1000 times the force of gravity. Thus, a balancing vertical component in the counter force is only $1/1000$ and the taper can be found directly by finding the arctan of $1/1000$. This is also the case for other speeds of rotation and different inner reactor diameters, as the angle can be adjusted so that the force of gravity and the vertical component of the counter force from the wall on the particles are balanced against each other.

In a preferred embodiment the reactor is formed with an outer layer of particles that is fastened to the sidewall of the reactor, for example, by sintering or fusing. The outer particle layer means longer from the centre axis than the inner particle layer, i.e. innermost against the reactor wall. Thereby it is not only simpler to get a particle layer but it will be simpler to get a layer of coarser particles outermost, nearest the wall and finer particles with a larger surface area innermost against the reactor body. Thereby, the particles will not so easily go through a separation over time so that it can be easier to achieve a layer with fine, non-contaminated particles with a large surface area innermost against the reactor body. Natural radial separation can otherwise lead to that coarse particles lie innermost and fine outermost against the wall of the reactor.

The reactor preferably comprises one outlet and at least one inlet at the same end, the inlet or the inlets are arranged concentrically outside the outlet. Thereby one end can be without perforations for simple placing on a rotating base and spent reaction gas, or residual gas or inert gas that can, for example, have a density $1/16$ of the density of rich reaction gas, will be taken out at the centre line where it will collect naturally, while rich reaction gas will be fed in nearer the sidewall where it collects naturally. In this way the flow pattern is improved. Alternatively, the inlet and the outlet can be at opposite ends so that the reactor is the through-flow reactor. One or more inlets can be arranged at the bottom and one or more outlets at the top, or vice versa.

In a preferred embodiment the reactor comprises several sub-volumes, for example, preferably cylindrical sub-volumes that sit fitted next to each other on, or along, a circle around the rotational axis of the reactor. This is an embodiment that has been tested and it had the advantage of having less turbulence inside the reactor and simpler feeding out of smaller blocks of silicon after completion of the process.

The reactor preferably comprises a particle layer of silicon powder formed by operation of the reactor containing reaction gas for chemical vapour deposition before the start-up of chemical vapour deposition for the production of solid silicon as will be explained in detail below.

The invention also provides a method for manufacture of silicon by chemical vapour deposition (CVD), preferably by the use of the reactor according to the invention. The method is characterised by producing a layer of particles from the reaction gas in the reactor and/or feed in particles for the formation of an inner layer of particles on the inner wall surface of the reactor, to feed in reaction gas for chemical vapour deposition, to produce solid silicon by chemical vapour deposition on the particle layer, to loosen the produced silicon from the particle layer and to take it out and to carry out any preparation of the inner surface of the reactor before the production of silicon continues by repeating the steps of the method.

The reactor is preferably kept warm when going through the steps of the method and in the rotation up to the step of the chemical vapour deposition, for efficient production.

A particle layer of silicon powder can advantageously be formed by the operation of the reactor containing reaction gas for chemical vapour deposition, preferably silane, before the start-up of chemical vapour deposition for production of solid silicon, by controlling the concentration and pressure of the reaction gas and temperature and speed of rotation of the reactor, so that, in the main, only silicon powder (so-called "fines" of different types) amorphous and/or crystalline is produced. In more detail, and with silane at atmospheric pressure, for example, the formation of amorphous silicon powder starts at a temperature of 420° C., at ca. 600-610° C. crystalline silicon powder is formed. Previously formed amorphous silicon powder can be converted to crystalline silicon powder at the temperature where crystalline silicon powder is formed directly. Note that there can be parallel unwanted reactions, particularly at other temperatures than those mentioned and other pressures, and with other gases. Therefore, it must be tested if the conditions that have been mentioned should be adjusted if the reactor contains gases other than silane.

The invention also provides an application of a reactor according to the invention for the manufacture of silicon by chemical vapour deposition (CVD).

The invention also provides the application of a loose and/or solid, easily disintegrating particle layer on the inner reactor wall in a reactor for chemical vapour deposition (CVD) of silicon for a simpler removal of the produced silicon from the reactor. Note that the embodiment of a solid, easily disintegrating particle layer is also valid for reactors that do not rotate.

The particle layer can comprise small and/or large particles that are hollow, compact or porous or with varying porosity in the form of a dust, powder, sand, small balls or other small particles that are placed or settle as a thin layer on the inside of the reactor or the inner wall of the container. It is an advantage to place or spray a thin layer of powder, small balls or other small particles on the inside of the reactor wall. The centripetal forces that arise in the rotating reactor container will hold the particles in place on the wall at the same time as they will help to form a layer with a circular inner cross section. The particles are distributed evenly over the inner wall of the reactor cylinder by the centripetal force after the reactor has been made to rotate.

The particles ought to be of a material that leads to very little contamination and does not fuse together or stick to each other at the operating temperature of the reactor. Particles of pure silicon are most preferred, but silicon nitrite and quartz are good alternatives. Commercial access to sand/particles of these materials is good and this will therefore be a cheaper alternative than reactors manufactured with a wall of a pipe section in the same material. By the use of super pure, fine silicon sand, at least innermost against the reactor body, the post-processing of the silicon block will be very simple as there is no need to remove a layer of a different material outermost on the block of silicon. Particles of different sizes and shapes can be used. The layer can comprise several tiers of different types of particles. It is preferred that the particles innermost against the reactor wall will have a size and shape that leads to a good slip when the block of silicon shall be taken out of the reactor, while the particles nearest the reactor body shall be suitable as a deposit surface for deposition of silicon.

The reactor according to the invention can comprise the features that are described here or illustrated in any operative combination, every such combination is an embodiment of the present invention. The method according to the invention can comprise features or steps that are described here or illustrated in any operative combination, every such combination is an embodiment of the present invention.

Although it is very much preferred that the reactor rotates during operation with chemical vapour deposition of solid silicon, and also during the formation of the particle layer of fine silicon powder, the rotation is not obligatory if the particle layer is solid but is loosely attached, that means the layer is easily broken up so that the silicon produced can easily be taken out of the reactor. The use of a solid, lightly bound, and thereby easily disintegrating layer of particles on the inner surface of a reactor for chemical vapour deposition of silicon to simplify the removal of solid silicon produced by chemical vapour deposition on the particle layer has not been known previously, the invention therefore contributes to simplified production also for reactors that do not rotate during production. For the particle layer which is completely or partially loose the reactor must, of course, be rotated during production such that the layer is held in place by the centripetal force.

FIGURES

Some embodiments of the invention are illustrated in the figures, in which

Figure 2:
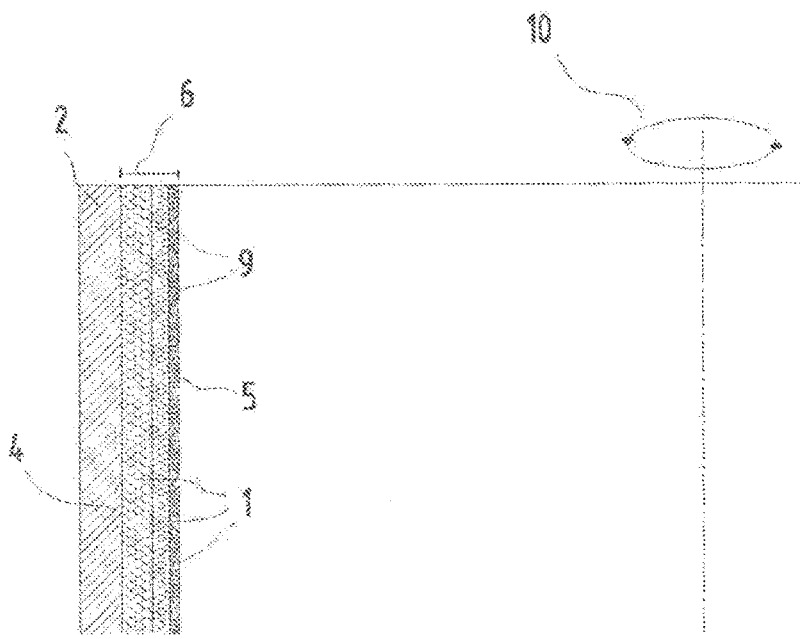
Figure 3:
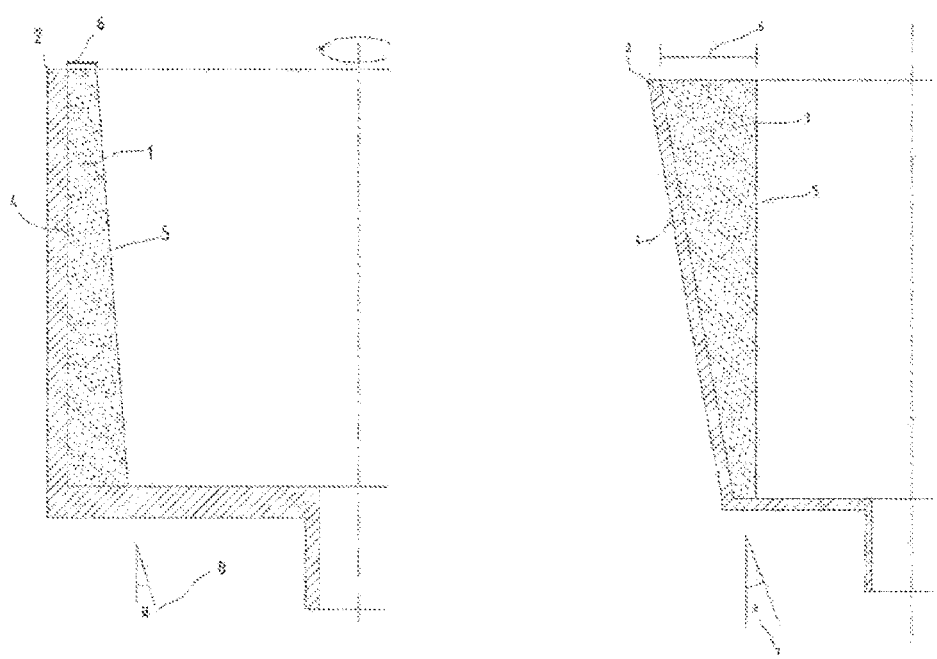

FIG. 1 illustrates a section of a circular reactor container with a layer of particles and the silicon depositing initiated, FIG. 2 illustrates a tiered particle layer with particles of different sizes and shapes, and FIG. 3 illustrates a particle layer put on at an angle and/or put on a tilted reactor wall.

DETAILED DESCRIPTION

Reference is made to FIG. 1. The reactor comprises, in the main, a container (2), preferably formed as a cylinder with a circular, or approximately circular cross section, with an inlet for gas at the one end and an outlet at the other end or same end, and with the supply of heat on the outside and possibly on the inside too. The reactor is operatively arranged to an appliance to set the reactor in rotation (10), such as a motor. The particles (1) are distributed over the inner wall (4) of the reactor container (2) after it has been made to rotate (10) so that there will be an even layer of particles on the whole of the reactor wall (4). Thereby, the particles (1) will lie as a layer of particles (6) on the inside (4) of the reactor tube (2) and appear as an inner tube in the reactor container (2). The silicon deposits (3) will first be formed on the inside (5) of the particle layer (6).

The particles (1) can be in the form of sand, dust or small balls in a hollow, porous or compact form, preferably of a material that leads to very little contamination. Examples of preferred materials are quartz and silicon nitrite, but most preferred will be particles of sand or dust of super pure crystalline silicon. The deposits (3) of silicon will start on the inside (5) of the particle layer (6) so that the particle layer (6) remains lying between the reactor wall (2) and the silicon deposits (3). The inside (5) of the particle layer (6) comes in direct contact with the silicon deposits (3) and it is therefore important that the particle layer (6) does not contaminate the silicon (3). The particle layer (6) of a non-contaminating material will act as a barrier against contamination from the reactor wall (2) and all other materials and matter lying outside. In addition to that the particle layer (6) ensures that there is no direct contact between the silicon deposits (3) and the inside (4) of the reactor container (2) the large centripetal forces at the reactor wall (4) generated by the rotation (10) will work against diffusion of material in towards the silicon deposits (3). Therefore, a particle layer (6) with non-contaminating particles (1) on the inside (4) of the rotating (10) reactor container (2) will lead to very pure silicon deposits (3).

The particle layer (6) should preferentially be put onto the inside (4) of the reactor container (2) after the reactor has started to rotate (10). The particles (1) can be sprayed onto the reactor wall (4) and the thickness and form can be adjusted afterwards by going down with a tool that touches the particle layer (6) according to the principle of a lathe. The centripetal force will ensure that the particles (1) remain on the reactor wall (4). The same force will also ensure that the particles (1) distribute themselves evenly over the reactor wall (4). The particles (1) can have different sizes and shapes, either as dust, sand or small balls.

Reference is made to FIG. 2. The particles can be put on in a tiered fashion (9), with x number of layers of particles of a similar or different material and/or sizes and shapes in every tier, preferably with particles (1) with a round ball shape or approximate round ball shape against the reactor wall (4) and smaller particles (1) against the silicon deposits (5). This will be preferred when a completed block of silicon shall be taken out of the reactor. The ball formed particles against the reactor wall (4) will function as a ball-bearing between the block of silicon (3) and the reactor wall (4). Another preferential putting on of the particle layer (6), illustrated in FIG. 3, is to put on the particle layer at an angle (8) and/or on a slanting (7) reactor wall (4). This can provide a favourable effect when the block of silicon (3) shall be taken out, in that the block of silicon (3) will have a taper (7 and 8) from the reactor wall (4) and the particle layer (6). Particles (1) that are deformed or crushed when exposed to a certain pressure can also be advantageous to take up expansion from heat and simplify the taking out of the block of silicon.

When the particle layer (1) is distributed over the reactor wall (4) the CVD process can start. A silicon-containing reaction gas (11) is fed into the reactor through an inlet at the one end of the reactor. The reaction gas (11) is forced outwards towards the particle layer (6) by the centripetal forces, where it is heated up to above the decomposition temperature. Super pure silicon (3) is then deposited on the inside (5) of the layer of particles so that the reactor body gradually becomes overgrown. The process is stopped when the reactor body is blocked by growth, or until there is no purpose in continuing to run the reactor any further. The supply of reaction gas (11) and the block of silicon (3) is taken out. A new particle layer (6) is put on and the process can start up again. With the use of silicon sand in the particle layer (6) nearest the silicon deposits (5) the need for processing of the finished block of silicon will be less.

The invention claimed is:

1. A reactor for manufacture of solid silicon by chemical vapour deposition (CVD), the reactor comprising:
   a reactor body;
   a rotation device operatively arranged to the reactor, wherein the rotation device is configured to constantly rotate the reactor around an axis during production of the solid silicon by the CVD;
   at least one sidewall that surrounds the reactor body and is non-parallel to the axis;
   at least one inlet for silicon-containing reaction gas;
   at least one outlet for residual gas;
   a temperature control appliance consisting essentially of a heat appliance operatively arranged to the reactor, wherein the heat appliance is configured to heat the at least one sidewall;
   a loose particle layer on an inner surface of the at least one sidewall, the loose particle layer being held in place by rotation of the reactor body during the manufacture of solid silicon by the CVD; and
   wherein the CVD takes place on the loose particulate layer.

2. The reactor according to claim 1, wherein
   the loose particle layer comprises a material that minimizes contamination of the solid silicon, wherein the material comprises particles of solid silicon of metallurgic quality or purer.

3. The reactor according to claim 1, wherein the loose particle layer, at least across a part of a thickness, is comprised of round particles.

4. The reactor according to claim 1, wherein the reactor is shaped as a pipe section, wherein the pipe section is configured to rotate around a rotational axis of the reactor.

5. The reactor according to claim 1, wherein the reactor is formed as a standing conical pipe section that can rotate about a longitudinal axis with a circular inner cross section and a largest diameter at an upper end.

6. The reactor according to claim 1, wherein the reactor is formed with an outer particle layer, wherein the outer particle layer is fastened to the at least one sidewall.

7. The reactor according to claim 1, comprising an outlet and at least one inlet at a same end, wherein the at least one inlet is arranged concentrically outside the outlet.

8. The reactor according to claim 1, comprising a particle layer of silicon powder formed by operating the reactor containing reaction gas for the CVD before the CVD is initiated.

9. A method for manufacture of solid silicon by chemical vapour deposition (CVD), the method comprising:
   constantly rotating a reactor around an axis, the reactor containing particles imported to or produced in the reactor to produce a loose particle layer on an inner reactor wall of, wherein the inner reactor wall is non-parallel to the axis;
   importing silicon-containing reaction gas for the CVD;
   rotating the reactor and heating the inner reactor wall while producing solid silicon by the CVD on an inside of the loose particle layer;
   loosening the solid silicon from the loose particle layer; and
   taking the solid silicon out and carrying out any preparation of an inner surface of the reactor before repeating the steps of the method.

10. The reactor according to claim 1, wherein the loose particle layer is placed at an angle relative to the axis.

11. The reactor according to claim 1, wherein the at least one sidewall is slanted relative to the axis.

12. The reactor according to claim 1, wherein the at least one sidewall is at an acute angle relative to the axis.

13. The reactor according to claim 1, wherein the at least one sidewall is tilted relative to the axis.

14. The reactor according to claim 1, wherein the at least one sidewall is tapered relative to the axis.

15. The method according to claim 9, wherein the reactor is kept warm during the method steps and in rotation up to the CVD.

16. The method according to claim 9, wherein a particle layer of silicon powder is formed during operation of the reactor containing reaction gas for the CVD before starting up the chemical vapour deposition, by control of concentration and pressure of the reaction gas, temperature and speed of rotation of the reactor so that at least one of silicon powder, amorphous and crystalline, is formed.

17. A method of manufacture of solid silicon by chemical vapour deposition (CVD), the method comprising:
   producing silicon via a reactor comprising:
      a reactor body;
      a rotation device operatively arranged to the reactor, wherein the rotation device is configured to constantly rotate the reactor around an axis during production of the solid silicon by CVD;
      at least one sidewall that surrounds the reactor body and is non-parallel to the axis;
      at least one inlet for silicon-containing reaction gas;
      at least one outlet for residual gas;
      a temperature control appliance consisting essentially of a heat appliance operatively arranged to the reactor, wherein the heat appliance is configured to heat the at least one sidewall;
      a loose particle layer on an inner surface of the at least one sidewall, the loose particle layer being held in place by rotation of the reactor body during the manufacture of solid silicon by the CVD; and
      wherein the CVD of solid silicon takes place on the loose particulate layer.

18. The method of claim 17, wherein the producing comprises applying a loose particle layer on the inner surface of the at least one sidewall in the reactor, wherein the loose particle layer facilitates removal of the manufactured solid silicon from the reactor.

* * * * *